United States Patent
Tsai et al.

(10) Patent No.: US 7,598,176 B2
(45) Date of Patent: Oct. 6, 2009

(54) METHOD FOR PHOTORESIST STRIPPING AND TREATMENT OF LOW-K DIELECTRIC MATERIAL

(75) Inventors: Jang-Shiang Tsai, Taipei County (TW); Yi-Nien Su, Kaohsiung (TW); Chung-Chi Ko, Nantou (TW); Jyu-Horng Shieh, Hsin-Chu (TW); Peng-Fu Hsu, Hsinchu (TW); Hun-Jan Tao, HsinChu (TW)

(73) Assignee: Taiwan Semiconductor Manufacturing Co. Ltd., Hsin-Chu (TW)

( * ) Notice: Subject to any disclaimer, the term of this patent is extended or adjusted under 35 U.S.C. 154(b) by 716 days.

(21) Appl. No.: 10/949,128

(22) Filed: Sep. 23, 2004

(65) Prior Publication Data

US 2006/0063386 A1    Mar. 23, 2006

(51) Int. Cl.
*H01L 21/311* (2006.01)

(52) U.S. Cl. .................. 438/694; 438/725; 438/958; 257/E21.026; 257/E21.027

(58) Field of Classification Search .............. 438/725, 438/726, 776, 777, 909, 906, 694, 695, 948, 438/958; 216/37, 64; 257/E21.024, E21.026, 257/E21.027

See application file for complete search history.

(56) References Cited

U.S. PATENT DOCUMENTS

| | | | |
|---|---|---|---|
| 5,900,163 A * | 5/1999 | Yi et al. | 216/79 |
| 6,030,901 A | 2/2000 | Hopper et al. | |
| 6,235,453 B1 | 5/2001 | You et al. | |
| 6,316,354 B1 * | 11/2001 | Hu | 438/652 |
| 6,346,490 B1 | 2/2002 | Catabay et al. | |
| 6,426,304 B1 | 7/2002 | Chien et al. | |
| 6,436,808 B1 * | 8/2002 | Ngo et al. | 438/623 |
| 6,465,372 B1 | 10/2002 | Xia et al. | |
| 6,528,432 B1 | 3/2003 | Ngo et al. | |
| 6,562,700 B1 * | 5/2003 | Gu et al. | 438/477 |
| 6,583,047 B2 * | 6/2003 | Daniels et al. | 438/623 |
| 6,638,875 B2 | 10/2003 | Han et al. | |
| 6,824,699 B2 * | 11/2004 | Dobson | 216/44 |
| 6,846,749 B1 * | 1/2005 | Gabriel et al. | 438/714 |
| 2002/0110992 A1 * | 8/2002 | Ho | 438/389 |
| 2004/0087169 A1 * | 5/2004 | Seta et al. | 438/709 |
| 2005/0077629 A1 * | 4/2005 | Dalton et al. | 257/759 |
| 2007/0193602 A1 * | 8/2007 | Savas et al. | 134/1.1 |

* cited by examiner

*Primary Examiner*—Caridad M Everhart
(74) *Attorney, Agent, or Firm*—Duane Morris LLP

(57) ABSTRACT

A plasma processing operation uses a gas mixture of $N_2$ and $H_2$ to both remove a photoresist film and treat a low-k dielectric material. The plasma processing operation prevents degradation of the low-k material by forming a protective layer on the low-k dielectric material. Carbon from the photoresist layer is activated and caused to complex with the low-k dielectric, maintaining a suitably high carbon content and a suitably low dielectric constant. The plasma processing operation uses a gas mixture with $H_2$ constituting at least 10%, by volume, of the gas mixture.

20 Claims, 1 Drawing Sheet

METHOD FOR PHOTORESIST STRIPPING AND TREATMENT OF LOW-K DIELECTRIC MATERIAL

FIELD OF THE INVENTION

The invention relates most generally to semiconductor devices with reduced capacitance loading due to the use of a low-k dielectric, and a method for manufacturing such semiconductor devices.

BACKGROUND

The escalating requirements for high-density and performance associated with ultra large scale integration (ULSI) semiconductor devices require responsive changes in interconnection technology. Low dielectric constant (low-k) inter-level dielectric (ILD) materials have been found effective in mitigating RC (resistance capacitance) propagation delays to reduce power consumption and crosstalk. Materials which show promise as low-k ILDs include various carbon-containing materials. Such carbon-containing low-k dielectric materials include various polymers with carbon occupying a position in the backbone of the polymer. Typical of such carbon-containing polymers are benzocyclobutene (BCB), methyl silsesquioxane (MSQ), Flare-R®, Silk®, JSR, Orion, and Black Diamond®. Although materials having a dielectric constant of less than about 3.9 are considered low-k dielectric materials, as integrated circuit devices and interconnect technologies continue to scale smaller, low-k dielectric materials with even lower dielectric constants have become useful, and it is increasingly popular and advantageous to use materials having dielectric constants less than or equal to 3, i.e., $k \leq 3$. The challenges posed by the increasingly fragile and higher carbon content of the $k \leq 3$ materials impact plasma technology used in the manufacture of semiconductor devices because the Si—$CH_3$, Si—C, and other carbon bonds in the low-k dielectric material are susceptible to be attacked by plasma processing.

Conventional methods often employ a plasma treatment of the low-k dielectric film after it is formed, to improve mechanical properties such as hardness and to reduce susceptibility to subsequent plasma attack. Following the plasma treatment, conventional photoresist patterning is carried out, the low-k dielectric film is etched and the photoresist film removed. The organic photoresist film is conventionally removed in a dry plasma process that uses oxygen. Plasma excitation during the stripping process results in atomic oxygen which oxidizes the organic photoresist into gases such as CO, $CO_2$ and $H_2O$ that are easily removed from the stripping chamber by conventional pumping. This stripping process undesirably degrades the low-k dielectric material because the oxygen used in the stripping process also combines with carbon from the low-k dielectric film, disrupts existing carbon bonds, and causes the carbon to leach out of the low-k dielectric film. The loss of carbon undesirably causes the dielectric constant of the film to increase. Another shortcoming of this conventional method is that the post-deposition plasma treatment only treats the top surface of a low-k dielectric film after deposition and does not treat surfaces of the film that become exposed during the subsequent etching process used to form trenches, vias, contacts and other openings in the low-k dielectric material.

It would therefore be desirable to provide a method for manufacturing a semiconductor device that overcomes the above shortcomings and does so in an efficient, streamlined processing sequence.

SUMMARY OF THE INVENTION

To address these and other needs, and in view of its purposes, an aspect of the invention provides a method for stripping photoresist and treating a dielectric to prevent dielectric constant degradation using a single plasma operation. The method comprises providing a dielectric over a substrate, forming a photoresist film over the dielectric before treating the dielectric with a plasma, patterning the photoresist film, etching at least an opening in the dielectric, and stripping the patterned photoresist film and treating the dielectric with carbon in a single plasma operation. Process conditions of the stripping and the treating are controlled to cause carbon from the photoresist to at least one of penetrate and complex with the dielectric film. The single plasma operation may use a gas mixture of $N_2$ and $H_2$ in which the $H_2$ concentration is larger than 10%.

In another aspect, provided is a method for stripping photoresist and treating a carbon-containing dielectric to prevent dielectric constant degradation, in a single plasma operation. The method comprises providing a carbon-containing dielectric over a substrate, forming a photoresist film over the carbon-containing dielectric before treating the carbon-containing dielectric with a plasma, patterning the photoresist film and etching at least an opening in the carbon-containing dielectric, and stripping the patterned photoresist film and treating the carbon-containing dielectric with carbon in a single plasma operation that includes a gas mixture of $H_2$ and $N_2$. The gas mixture may contain a greater volume of $H_2$ than $N_2$ in an exemplary embodiment.

In another aspect, provided is a method for stripping photoresist and treating a carbon-containing dielectric to prevent dielectric constant degradation in a single plasma operation. The method comprises providing a carbon-containing dielectric over a substrate, forming a photoresist film over the carbon-containing dielectric before treating the carbon-containing dielectric with a plasma, patterning the photoresist film and etching at least an opening in the carbon-containing dielectric, and stripping the patterned photoresist film and forming a protective layer on the carbon-containing dielectric in a single plasma operation. The protective layer comprises at least one of an Si—N material and an Si—O—N material.

BRIEF DESCRIPTION OF THE DRAWING

The present invention is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing, which include the following cross-sectional views.

DETAILED DESCRIPTION

An aspect of the invention provides a plasma operation that both strips photoresist and treats the surface of a low-k dielectric material, avoids carbon leaching and maintains a suitably low dielectric constant and suitably low RC characteristics.

A low-k dielectric film may be formed on any of various semiconductor devices. Conventional formation methods may be used and the low-k dielectric film may advantageously have a dielectric constant no greater than 3, but other dielectric constants up to 3.9 may be used in other exemplary embodiments. The low-k dielectric film may be a carbon-containing film that includes bonds such as Si—CH$_3$ and Si—C bonds, but other carbon bonds may be included depending on the composition and nature of the low-k dielectric film. The low-k dielectric film may include various thicknesses and some suitable materials that may be used as the low-k material are BCB, MSQ, Flare-R®, Silk®, JSR, Orion, Black Diamond®, other similarly available commercial materials, various polymers and polyimides, carbon-doped SiO$_2$, and other carbon-containing dielectric materials. The low-k dielectric material may be an interlevel dielectric used in various applications. Various openings such as vias, contact openings, and trenches for damascene interconnect lines, may subsequently be formed in the low-k dielectric material. An aspect of the invention is that a plasma treatment is not performed on the low-k dielectric film after deposition: rather; the low-k dielectric film is coated with a photosensitive patterning medium prior to the low-k dielectric film undergoing any plasma treatment. In one exemplary embodiment, a photoresist film is formed over the top surface of the low-k dielectric film and an anti-reflective coating (ARC) may optionally be formed between the low-k dielectric film and the photoresist. Conventional ARC and photoresist materials may be used. The photoresist is a carbon-containing, organic material. Various photoresists having various thicknesses may be used.

Figure 1:
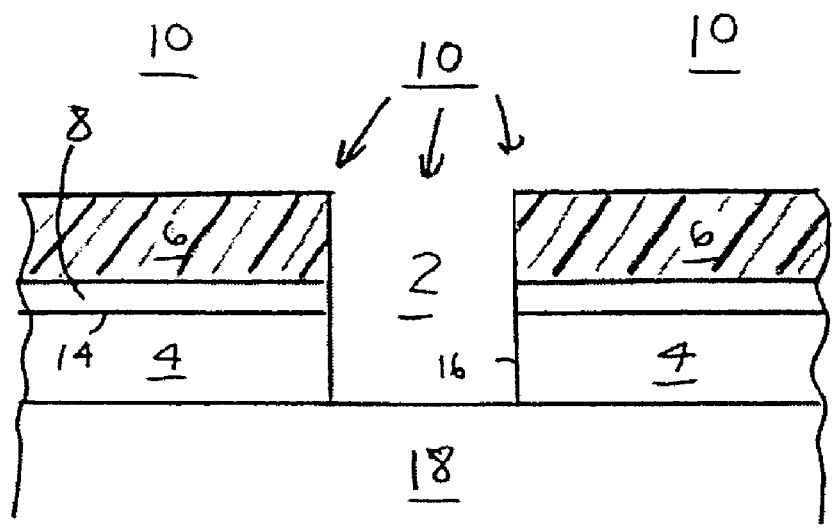
FIG. 1 shows an exemplary opening in a low-k dielectric film and illustrates the plasma treatment/photoresist stripping process.

Conventional photoresist patterning techniques are used and followed by conventional etching techniques to form openings in the low-k dielectric film and to form the exemplary structure shown in FIG. 1. The openings may be contact openings, vias, trenches, dual damascene trenches, and the like. FIG. 1 shows exemplary opening 2 formed in low-k dielectric film 4 after the patterning and etching processes have been carried out. The structure also includes optional ARC layer 8 and photoresist film 6, each as described above. Low-k dielectric film 4 is as described above and includes top surface 14, which has not yet been subjected to plasma treatment, and sidewall surfaces 16 that were exposed during the etching process. An aspect of the invention provides a plasma operation that both removes photoresist film 6 and treats the surfaces 14 and 16 of low-k dielectric film 4 as they become exposed. The use of this single plasma operation to both strip photoresist and treat the low-k dielectric material simplifies the processing sequence and reduces cycle time. The tool used to perform the plasma processing operation may be a reactive ion etcher, a microwave plasma tool, an ICP (Inductively Coupled Plasma) etching tool, a magnetically enhanced reactive ion etcher, downstream strippers or other tools that are commercially available to perform plasma processing operations by generating and controlling plasmas. Plasma 10 is generated within the processing chamber and in the vicinity of substrate 18. During the plasma processing operation, a bias may be applied to substrate 18 causing the energized plasma species to be directed towards the surface of substrate 18. The plasma processing operation may include a gas mixture of N$_2$ and H$_2$. The volumetric concentration of H$_2$ gas in the gas mixture may exceed 10%. In one embodiment, the gas mixture may contain more H$_2$ than N$_2$ by volume. The volume percentage of N$_2$ in the gas mixture may range from 10-70% by volume in various exemplary embodiments and the volume percentage of H$_2$ in the gas mixture may range from 30-90 volume % in various exemplary embodiments.

The pressure may range from 5-10 torr in one exemplary embodiment, but other pressures may be used. The source power for the plasma may range from 1000-1500 Watts, but other powers may be used in other exemplary embodiments. The bias power applied to substrate 18 may be 400 Watts or less in various exemplary embodiments. The temperature during the plasma processing operation that both strips photoresist 6 and treats the exposed surfaces of low-k dielectric film 4, may range from room temperature (about 25° C.) to about 200° C. During this plasma processing operation, the photoresist may be stripped/removed at a rate of around 3500 Å/minute, but the photoresist removal rate may vary and will depend on the particular process parameters as well as the photoresist material.

Figure 2:
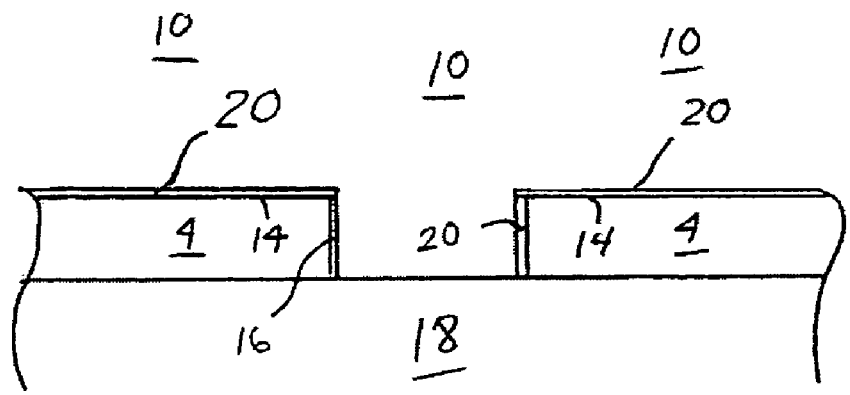
FIG. 2 shows the structure of FIG. 1 after the photoresist film has been removed and the surfaces of the low-k material treated.

The plasma processing operation also treats the exposed surfaces of the low-k dielectric material 4 such as surfaces 14 and 16 shown in FIG. 2 which illustrates the structure after the photoresist and optional ARC material have been removed. The plasma processing conditions are chosen to enable plasma 10 to cause carbon from the photoresist material that is being removed, to penetrate low-k dielectric film 4 and complex with materials in the low-k dielectric film to maintain a suitably high carbon content and, therefore, a suitably low dielectric constant. The photoresist film therefore acts as a carbon source. The carbon from the photoresist material forms bonds with the materials within dielectric film 4 and reduces low-k damage. Carbon leaching from low-k dielectric film 4 is prevented. Pore sealing of the low-k dielectric material is accomplished by the single plasma operation. The plasma processing operation treats low-k dielectric film 4 by forming a thin layer 20 on surfaces 14 and 16 whereas a bulk treatment performed prior to etching would leave sidewall surfaces 16 untreated. The applicants have found, through XPS analysis, that thin layer 20 formed on surfaces 14 and 16 may be Si—N and Si—O—N type structures similar to silicon nitride and silicon oxynitride, respectively, but other silicon, oxygen, and nitrogen-containing structures may be formed. Protective thin layer 20 may be a material that includes at least one of Si—N and Si—O—N type materials. Protective thin layer 20 protects the low-k material against future plasma damage, prevents subsequent carbon leaching, and has also been found to improve mechanical properties such as hardness. Depending on the thickness of the photoresist film being removed, various times may be used for the plasma processing operation and a generous overetching time may be used after the conclusion of the photoresist removal, to insure the appropriate plasma treatment of the low-k dielectric material that occurs when the photoresist is removed and the low-k dielectric surfaces exposed.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical,", "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for stripping photoresist and treating a dielectric to prevent dielectric constant degradation, in a single plasma operation, said method comprising:
providing a dielectric over a substrate;
forming a photoresist film over an upper surface of said dielectric before treating said dielectric with a plasma;
patterning said photoresist film and etching at least an opening in said dielectric; and
using a single plasma operation to both strip said patterned photoresist film and treat at least said upper surface of said dielectric with carbon, said single plasma operation having process conditions that cause carbon from said photoresist to at least one of penetrate and complex with said dielectric.

2. The method as in claim 1, wherein said single plasma operation uses a gas mixture including $H_2$ and $N_2$, in which a $H_2$ concentration is greater than a $N_2$ concentration.

3. The method as in claim 1, wherein said single plasma operation uses a gas mixture including $H_2$ and $N_2$ in which a $H_2$ concentration is greater than 10% of said gas mixture.

4. The method as in claim 1, wherein said single plasma operation includes a gas mixture including $N_2$ and $H_2$ and said $N_2$ constitutes 10-70 volume % of said gas mixture and said $H_2$ constitutes 30-90 volume % of said gas mixture.

5. The method as in claim 1, wherein said dielectric contains carbon.

6. The method as in claim 1, wherein said dielectric is a low-k dielectric film with a dielectric constant no greater than 3.

7. The method as in claim 1, further comprising forming an anti-reflective coating between said photoresist film and said dielectric.

8. The method as in claim 1, wherein said treat at least said upper surface of said dielectric with carbon comprises forming a protective layer on exposed portions of said upper surface of said dielectric, said protective layer comprising at least one of an Si—N material and an Si—O—N material.

9. The method as in claim 1, wherein said treat at least said upper surface of said dielectric with carbon comprises forming a protective layer that prevents carbon leaching, on exposed portions of said upper surface of said dielectric.

10. The method as in claim 1, wherein said single plasma operation is carried out at a temperature within the range of 25-200° C. and a pressure within the range of 5-10 torr.

11. The method as in claim 1, wherein said single plasma operation includes a bias power less than 400 watts and a plasma power within the range of about 1000 to 1500 watts.

12. The method as in claim 1, wherein said single plasma operation strips said patterned photoresist film and treats said upper surface of said dielectric with carbon substantially simultaneously.

13. The method as in claim 1, wherein said single plasma operation uses a gas mixture that is void of carbon.

14. A method for stripping photoresist and treating a carbon-containing dielectric to prevent dielectric constant degradation, in a single plasma operation, said method comprising:
providing a carbon-containing dielectric over a substrate;
forming a photoresist film over an upper surface of said carbon-containing dielectric before treating said carbon-containing dielectric with a plasma;
patterning said photoresist film and etching at least an opening in said carbon-containing dielectric; and
stripping said patterned photoresist film and treating at least said upper surface of said carbon-containing dielectric with carbon, in a single plasma operation that includes a gas mixture of $H_2$ and $N_2$, wherein said gas mixture contains greater than 10 volume percent of $H_2$.

15. The method as in claim 14, wherein said gas mixture contains a greater volume % of $H_2$ than $N_2$.

16. The method as in claim 14, wherein said single plasma operation includes a gas mixture that is void of carbon.

17. The method as in claim 14, wherein said treating comprises forming a protective layer on exposed portions of said upper surface of said dielectric, said protective layer comprising at least one of an Si—N material and an Si—O—N material.

18. The method as in claim 14, wherein said treating comprises causing carbon from said photoresist to at least one of penetrate and complex with said upper surface of said dielectric.

19. The method as in claim 14, wherein said single plasma operation is carried out at a temperature within the range of 25-200° C., a pressure within the range of 5-10 torr, a bias power less than 400 watts and a plasma power within the range of about 1000 to 1500 watts.

20. A method for stripping photoresist and treating a carbon-containing dielectric to prevent dielectric constant degradation, in a single plasma operation, said method comprising:
providing a carbon-containing dielectric over a substrate;
forming a photoresist film over an upper surface of said carbon-containing dielectric before treating said carbon-containing dielectric with a plasma;
patterning said photoresist film and etching at least an opening in said carbon-containing dielectric; and
stripping said patterned photoresist film and forming a protective layer on at least said upper surface of said carbon-containing dielectric in a single plasma operation, said protective layer comprising at least one of an Si—N material and an Si—O—N material, wherein said single plasma operation includes a gas mixture including $H_2$ and $N_2$, and in which a $H_2$ concentration is greater than a $N_2$ concentration.

* * * * *